United States Patent [19]

Gagnepain et al.

[11] 4,220,888  
[45] Sep. 2, 1980

[54] DOUBLE AND TRIPLE ROTATED QUARTZ PLATES FOR SURFACE WAVES

[75] Inventors: Jean-Jacques Gagnepain, Recologne; Daniel Hauden, Besancon; Claude Pegeot, Sartrouville; Monique Michel, Ostwald, all of France

[73] Assignee: Quartz et Electronique, Asnieres, France

[21] Appl. No.: 42,648

[22] Filed: May 25, 1979

[30] Foreign Application Priority Data

May 25, 1978 [FR] France .................... 78 15560

[51] Int. Cl.² .......................... H01L 41/18
[52] U.S. Cl. ...................... 310/361; 310/313 R
[58] Field of Search .......... 310/313, 361; 333/150, 333/193

[56] References Cited

U.S. PATENT DOCUMENTS 3,826,931  7/1974  Hammond .................... 310/361

OTHER PUBLICATIONS

Handbook of Piezoelectric Crystals by J. P. Buchanan, WADC Technical Report 54-248, Dec. 1954, pp. 29-35 (sections on NT, MT and V cut crystals).

*Primary Examiner*—Mark O. Budd  
*Attorney, Agent, or Firm*—Sughrue, Rothwell, Mion, Zinn and Macpeak

[57] ABSTRACT

The invention relates to quartz plates. The plate is a plate with double rotation. The angle $\phi$ lies between 6° and 10°. The angle $\theta$ lies between $-41°45'$ and $-38°55'$. The direction of propagation forms an angle of $\Psi$ with an axis deduced from the electrical axis by the rotation $\phi$ of the plate and $\Psi$ lies between 26° and 28°. The angles $\phi$, $\theta$ and $\Psi$ satisfy the equation $\phi - \theta - \Psi = 21°42' \pm 8'$. Application to surface waves.

8 Claims, 2 Drawing Figures

DOUBLE AND TRIPLE ROTATED QUARTZ PLATES FOR SURFACE WAVES

The invention relates to quartz plates for surface waves.

Quartz crystals are used for making delay lines and surface wave resonators.

Oscillators and filters can be mentioned among the main applications of quartz.

Under the effect of temperature, firstly, the characteristics of the surface wave are modified by variation of the density and the elastic constants of the crystal and secondly, the dimensions of the substrate change. This results in a variation in the delay of the line or in the resonant frequency of the resonator and therefore in a variation in the frequency of the oscillator or in the characteristics of the filter.

The frequency variation can be represented by the following polynomial equation:

$$f(T) = f(T_o)\{1 + \alpha_f^{(1)}(T-T_o) + \alpha_f^{(2)}(T-T_o)^2 + \alpha_f^{(3)}(T-T_o)^3\}$$

The coefficients $\alpha_f^{(n)}$ are called temperature coefficients and characterize the sensitivity of the surface wave device to temperature.

It is well-known that plates are cut with reference to a trihedron OXYZ defined by three axes OX, OY, OZ which are:
- an electrical axis OX;
- a mechanical axis OY which forms an angle of 90° with the axis OX; and
- the optical axis OZ of the crystal.

Figure 1:
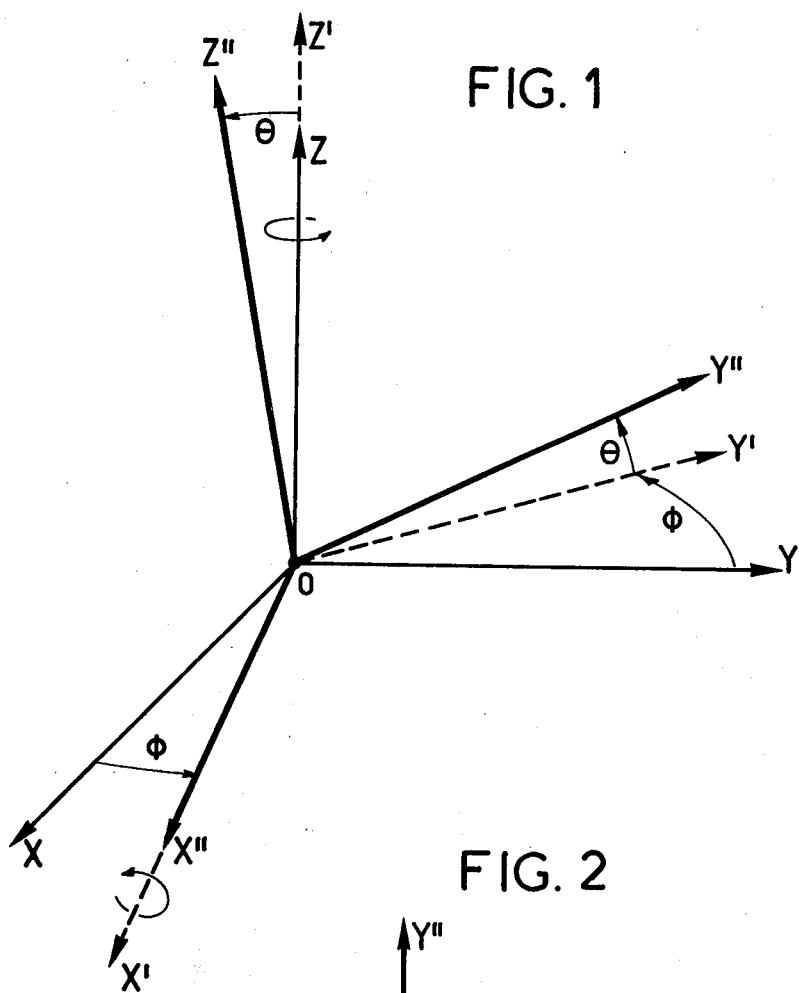

Conventionally, a plane of cut is defined by two angles of rotation $\phi$ and $\theta$, the angle $\phi$ corresponding to a first rotation of the trihedron referenced OXYZ about the axis OZ; we therefore obtain the trihedron OX'Y'Z' as in FIG. 1, the axis OZ' coincident with OZ. The angle $\theta$ corresponds to a rotation of the trihedron OX'Y'Z' about the axis OX'; we therefore obtain the trihedron OX"Y"Z", with the axis OX" coincident with OX'. The cut plane and therefore the plane of the plates is the plane OX"Z".

For known cuts, such as, for example, AT, BT, Y or ST, the angle of first rotation $\phi$ is zero.

When the angle of first rotation $\phi$ is non-zero, the cuts are referred to as double rotation cuts and the plates are in the plane OX"Z" (see FIG. 1).

The quartz cuts used at present for the majority of surface wave applications are single rotation cuts Y, Y+$\theta$ and ST in which the direction of propagation at the surface is parallel to the crystallographic axis OX. These cuts have the following characteristics:

cut Y, X: $\alpha_f^{(1)} = +24$ ppm/°C. $\alpha_f^{(2)} = -15 \times 10^{-3}$ ppm/°C.², which gives a relative frequency variation of $\Delta f/f$ equal to 700 ppm from 0° C. to 50° C. and equal to 1100 ppm from $-20°$ C. to 75° C.; and cut ST, X: $\alpha_f^{(1)} = 0$   $\alpha_f^{(2)} = -40 \times 10^{-3}$ ppm/°C.², which gives $\Delta f/f$ equal to 30 ppm from 0° C. to 50° C. and equal to 90 ppm from $-20°$ C. to 75° C.

Of the cuts used at present, the ST cut is the one which has the best temperature characteristics, since $\alpha_f^{(1)} = 0$; the temperature coefficients $\alpha_f^{(1)}$ and $\alpha_f^{(2)}$ are not simultaneously zero for any of the cuts used.

It is also known that the relative frequency variation in single rotation quartz plates used for propagating surface waves is greater than that of single rotation plates used for propagating volume waves; therefore, for the AT cut, which is widely used for propagating volume waves, the relative frequency variation is $\Delta f/f = \pm 5$ ppm from $-20°$ C. to 80° C.

Preferred embodiments of the invention provide a quartz plate whose relative frequency variation over a given temperature range, when used for propagating surface waves is less than that of plates cut along an ST cut.

Such preferred embodiments of the invention also provide a quartz plate whose relative frequency variation over a given temperature range, when used for propagating surface waves, is about the same as that of plates cut along an AT cut used for propagating volume waves.

The present invention provides a quartz plate for surface waves, said plate being defined by a reference OXYZ in which the angles OX, OY and OZ are respectively an electrical axis, a mechanical axis and the optical axis of a crystal, wherein said plate is cut with a double rotation defined by two angles $\phi$ and $\theta$, $\phi$ being an angle of first rotation about the optical axis OZ and $\theta$ being an angle of second rotation about an axis OX' which forms the angle $\phi$ with the electrical axis OX after the first rotation, the angle of first rotation $\phi$ lying between 6° and 10° inclusive, the angle $\theta$ lying between $-41°45'$, and $-38°55'$ inclusive and the angles $\phi$ and $\theta$ satisfying the equation:

$$47°34' \leq \phi - \theta \leq 48°50'$$

Figure 2:
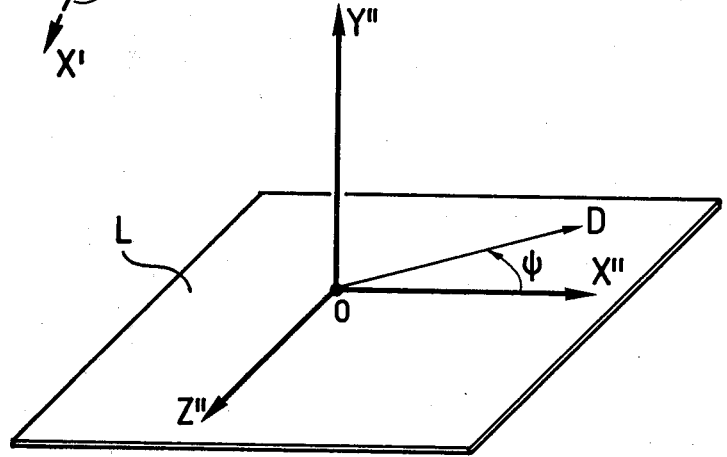

An embodiment of the invention is described in detail by way of example with reference to the accompanying drawing in which both FIGS. 1 and 2 are geometrical diagrams illustrating the relative positions of different sets of co-ordinate axes.

As defined above, a plate in accordance with the invention is produced by a double-rotation cut. FIG. 2 illustrates a plate L produced in the plane OX"Z" shown in FIG. 1. The axis OY" is perpendicular to the plate L.

In the plane of the plate, a straight line D which forms an angle $\Psi$ with the axis OX" represents the direction of surface propagation; when the plate L is provided in accordance with known technologies with transducers—one transmitting transducer and at least one receiving transducer—the straight line D represents the direction of propagation of surface waves from the transmitting transducer to the receiving transducer.

The angle $\phi$, $\theta$ and $\Psi$ of a plate in accordance with the invention are related by the equation:

$$\phi - \theta - \Psi = 21°42' \pm 8' \quad (1)$$

When the angles $\phi$, $\theta$ and $\Psi$ lie between the values set forth hereinbelow:

$$6° \leq \phi \leq 10° \quad (2)$$

$$-41°45' \leq \theta \leq -38°55' \quad (3)$$

$$26° \leq \Psi \leq 28° \quad (4)$$

the relative frequency variation is less than 15 ppm from 0° C. to 50° C. and less than 45 ppm from $-20°$ C. to 75° C.

Within the limits set forth by equations (2), (3), and (4), while still satisfying equation (1), the coefficients $\alpha_f^{(1)}$ and $\alpha_f^{(2)}$ are virtually zero simultaneously, for the following plates:

$$\left.\begin{array}{l}\phi = 9°48'\\ \theta = -39°\\ \psi = 27°\end{array}\right\} \alpha_f^{(1)} = 0, \alpha_f^{(2)} \approx 0.65 \times 10^{-3} \text{ ppm/°C}^2, \quad (1)$$

$$\alpha_f^{(3)} = 64 \times 10^{-6} \text{ ppm/°C}^3$$

This gives $\Delta f/f \leq 2$ ppm from 0° to 50° C.
and $\Delta f/f \leq 10$ ppm from $-20°$ to 75° C.

$$\left.\begin{array}{l}\phi = 6°20'\\ \theta = -41°30'\\ \psi = 26°\end{array}\right\} \alpha_f^{(1)} = 0, \alpha_f^{(2)} = 0, \alpha_f^{(3)} = -23 \times 10^{-6} \text{ ppm/°C}^3 \quad (2)$$

This gives $\Delta f/f \leq 1$ ppm between 0° and 50° C.
and $\Delta f/f \leq 4$ ppm between $-20°$ and 75° C.

A particularly advantageous plate is one in which the three frequency temperature coefficients are close to zero; it is defined by the angles:

$$\left.\begin{array}{l}\phi = 7°\\ \theta = -40°54'\\ \psi = 26°12'\end{array}\right\} \alpha_f^{(1)} = 0, \alpha_f^{(2)} = 0, \alpha_f^{(3)} = 1.2 \times 10^{-6} \text{ ppm/°C}^3$$

This gives:
$\Delta f/f \leq 0.2$ ppm between 0° C. and 50° C.
$\Delta f/f \leq 0.5$ ppm between $-20°$ C. and 75° C.
$\Delta f/f \leq 2$ ppm between $-60°$ C. and 110°

The relative frequency variation for such a plate is less than that of an AT plate which is about $\pm 5$ ppm in the $-20°$ C. to 80° C. temperature range; further, it is about the same but over a much wider temperature range, namely, $-60°$ C. to 110° C.; this allows these plates to be used to propagate surface waves over a wider temperature range than ST or Y plates, with performance comparable to those of plates in which the waves propagate in volume.

The tolerance of the angles $\phi$ and $\theta$ which define a plate is $\pm 30''$; the tolerance of the angle $\Psi$ is $\pm 2'$ and corresponds to the tolerance with which the surface transducers of the plate L are deposited.

It is deduced from equations (1) and (4) relating angles $\phi$, $\theta$, and $\Psi$ that the angles of the first and second rotations $\phi$ and $\theta$, which reference the cut of the quartz plate, satisfy the equation $47°34' \leq \phi - \theta \leq 48°50'$, taking into account, of course, equations (2) and (3). The plate thus cut is then fitted with transducers which define a direction of propagation which forms the angle $\Psi$ with the axis OX' so as to satisfy equations (1) and (4).

It is deduced from equation (1) relating angles $\phi$, $\theta$ and $\Psi$ that for a given angle $\Psi_1$, the angles $\phi$ and $\theta$ are related by the equation:

$$\phi - \theta = 21°42' + \Psi_1 \pm 8' \quad (5)$$

Equation 5 is of great practical interest. Indeed, if plates are defined by angles of cut $\phi_1$ and $\theta_1$ which satisfy equation (5) and in practice one angle or both angles do not have the required value, equation (5) is not satisfied. The equation $$\phi_1 - \theta_1 - \Psi_2 = 21°42' \pm 8'$$

may be satisfied with an angle $\Psi_2$ lying between 26° and 28°; this is the equivalent of adopting, for the angle $\Psi$, the value $\Psi_2$ instead of the value $\Psi_1$ originally adopted. Since the angle $\Psi$ is related to the deposition of the transducers, an error in the angles of cut $\phi_1$ and $\theta_1$ can be compensated when the transducers are deposited, taking into account, of course, equation (4) which defines the limits of variation for the angle $\Psi$.

The angles given by equations (2), (3) and (4) correspond to a certain domain of space; this domain is not the only one in quartz.

Other domains of space allow the cutting of quartz plates which have the same properties as those obtained in the domain described hereinbefore. They are determined by considerations of symmetry set forth hereinafter.

1. Symmetry of rotation of the angle $\phi$ (about OZ) by $2\pi/3$ $$Z(\theta,\phi,\psi) = Z\left(\theta,\phi + \frac{2\pi}{3}, \psi\right) = Z\left(\theta,\phi + \frac{4\pi}{3}, \psi\right)$$

whatever the angles $\theta$, $\phi$ and $\Psi$ may be.

2. $Z(-\theta, \pi - \phi, \Psi) = Z(\theta, \phi, \Psi)$ the symmetry of rotation (1) is maintained.

3. $Z(\theta, -\phi, \pi - \Psi) = Z(\theta, \phi, \Psi)$ symmetries (1) and (2) are maintained.

The cuts thus defined allow devices to be produced having surface wave propagation and which have improved temperature stability. In particular, oscillators in which it is not necessary to use high precision thermostats, which are often incompatible with bulk and power supply requirements. It can even be envisaged in some cases to do without any thermostat. The same applies in the case of filters and delay lines.

We claim:

1. A quartz plate for surface waves, said plate being defined by a reference OXYZ in which the angles OX, OY and OZ are respectively an electrical axis, a mechanical axis and the optical axis of a crystal, wherein said plate is cut with a double rotation defined by two angles $\phi$ and $\theta$, $\phi$ being an angle of first rotation about the optical axis OZ and $\theta$ being an angle of second rotation about an axis OX' which forms the angle $\phi$ with the electrical axis OX after the first rotation, the angle of first rotation $\phi$ lying between 6° and 10° inclusive, the angle $\theta$ lying between $-41°45'$ and $-38°55'$ inclusive and the angles $\phi$ and $\theta$ satisfying the equation:

$$47°34' \leq \phi - \theta \leq 48°50'$$

2. A quartz plate according to claim 1, including on its surface, transducers which define a direction of propagation of the surface waves which form an angle $\Psi$ with the axis OX' at the surface of the plate, the angle $\Psi$ lying between 26° and 28° inclusive, and the angles $\phi$, $\theta$ and $\Psi$ being related by the equation:

$$\phi - \theta - \Psi = 21°42' \pm 8'$$

3. A quartz plate according to claim 1, wherein the angles $\phi$, $\theta$ and $\Psi$ defined by the reference OXYZ related to an electrical axis of the quartz crystal satisfy the equation of symmetry in the crystal:

$$Z\left(\theta, \phi + \frac{2k\pi}{3}, \psi\right) = Z(\theta, \phi, \psi),$$

k assuming the values 1 and 2.

4. A quartz plate according to claim 1, wherein the angles $\phi$, $\theta$ and $\Psi$ satisfy the equation of symmetry in the crystal:

$$Z(-\theta, \pi-\phi, \Psi) = Z(\theta, \phi, \Psi)$$

5. A quartz plate according to claim 1, wherein the angles $\phi$, $\theta$ and $\Psi$ satisfy the equation of symmetry in the crystal:

$$Z(\theta, -\Psi, \pi-\Psi) = Z(\theta, \phi, \Psi)$$

6. A quartz plate according to claim 1, wherein the values of the angles $\phi$, $\theta$ and $\Psi$ are:

$$\phi = 9°48', \theta = -39°, \Psi = 27°$$

7. A quartz plate according to claim 1, wherein the values of the angles $\phi$, $\theta$ and $\Psi$ are:

$$\phi = 6°20', \theta = -41°30', \Psi 26°$$

8. A quartz plate according to claim 1, wherein the values of the angles $\phi$, $\theta$ and $\Psi$ are:

$$\phi = 7°, \theta = -40°54', \Psi = 26°12'.$$

* * * * *